(12) United States Patent
Dai (10) Patent No.: US 9,634,121 B2
(45) Date of Patent: Apr. 25, 2017

(54) METHOD OF MANUFACTURING DISPLAY PANEL

(71) Applicant: SHENZHEN CHINA STAR OPTOELECTRONICS TECHNOLOGY CO., LTD., Shenzhen, Guangdong (CN)

(72) Inventor: Tianming Dai, Guangdong (CN)

(73) Assignee: SHENZHEN CHINA STAR OPTOELECTRONICS TECHNOLOGY CO., LTD, Shenzhen (CN)

( * ) Notice: Subject to any disclaimer, the term of this patent is extended or adjusted under 35 U.S.C. 154(b) by 0 days.

(21) Appl. No.: 14/413,161

(22) PCT Filed: Jan. 24, 2014

(86) PCT No.: PCT/CN2014/071425
§ 371 (c)(1),
(2) Date: Jan. 6, 2015

(87) PCT Pub. No.: WO2015/106465
PCT Pub. Date: Jul. 23, 2015

(65) Prior Publication Data
US 2016/0315173 A1    Oct. 27, 2016

(30) Foreign Application Priority Data
Jan. 17, 2014 (CN) .......................... 2014 1 0023841

(51) Int. Cl.
*H01L 21/00* (2006.01)
*H01L 27/15* (2006.01)
(Continued)

(52) U.S. Cl.
CPC .... *H01L 29/66757* (2013.01); *H01L 27/1274* (2013.01); *H01L 29/6659* (2013.01); *H01L 29/78621* (2013.01)

(58) Field of Classification Search
CPC .............................................. H01L 2924/13069
(Continued)

(56) References Cited

U.S. PATENT DOCUMENTS 7,638,404 B2    12/2009  Cheng
2004/0023446 A1* 2/2004  Fujimura .......... H01L 29/66757
                                                    438/149
(Continued)

FOREIGN PATENT DOCUMENTS

CN       1355554 A      6/2002
CN       101118918 A    2/2008
(Continued)

OTHER PUBLICATIONS

Xiaoning Zhang, The International Searching Authority written comments, Nov. 2014, CN.
(Continued)

*Primary Examiner* — Julio J Maldonado
*Assistant Examiner* — Moin Rahman (57) ABSTRACT

A method of manufacturing a display panel having a plurality of lightly doped drain thin film transistors arranged as a matrix includes forming a semiconductor pattern with a predetermined shape on a substrate; forming a dielectric layer covering the semiconductor pattern on the substrate; forming a metal layer on the dielectric layer; forming a photoresist patterns smaller than the semiconductor pattern on the metal layer above the semiconductor pattern; etching the metal layer to form a gate electrode smaller than the photoresist pattern; doping high concentration ions by using the photoresist pattern as a mask to form a pair of highly (Continued)

doped regions on the semiconductor pattern not covered by the photoresist pattern; removing the photoresist pattern; and doping low concentration ions by using the gate electrode as a mask to form a pair of lightly doped regions between the highly doped regions and a part of the semiconductor pattern.

9 Claims, 6 Drawing Sheets

(51) Int. Cl.
*H01L 29/66* (2006.01)
*H01L 29/786* (2006.01)
*H01L 27/12* (2006.01)

(58) Field of Classification Search
USPC ............ 438/22–47, 69, 493, 503, 507, 956; 257/13, 79–103, 918, 40, 642–643, 759
See application file for complete search history.

(56) References Cited

U.S. PATENT DOCUMENTS

| | | | |
|---|---|---|---|
| 2004/0144988 A1* | 7/2004 | Jung | H01L 27/1285 257/98 |
| 2004/0263704 A1* | 12/2004 | Oh | G02F 1/136286 349/43 |
| 2006/0216874 A1* | 9/2006 | Cheng | H01L 29/78621 438/149 |
| 2008/0145981 A1* | 6/2008 | Kim | H01L 29/78621 438/163 |
| 2009/0011561 A1 | 1/2009 | Chen | |
| 2010/0227443 A1* | 9/2010 | Lee | H01L 21/02532 438/166 |
| 2011/0122330 A1* | 5/2011 | Tae | G02F 1/136213 349/39 |

FOREIGN PATENT DOCUMENTS

| | | |
|---|---|---|
| CN | 101236904 A | 8/2008 |
| CN | 102244037 A | 11/2011 |
| CN | 102403313 A | 4/2012 |
| CN | 103227150 A | 7/2013 |

OTHER PUBLICATIONS

Peter Van Zant, Microchip Fabrication a practical Guide to Semiconductor processing. Fifth Edition, Aug. 2010, p. 159-160, Publishing House of Electronics Industry, CN.

\* cited by examiner

METHOD OF MANUFACTURING DISPLAY PANEL

FIELD OF THE INVENTION

The invention relates to a method of manufacturing a display panel, and particularly, to a method of manufacturing a display panel with lightly doped drain structure thin film transistor.

BACKGROUND OF THE INVENTION

A lightly doped drain (LDD) structure thin film transistor (TFT) is usually made by a self-align method which needs to repeatedly etch a gate electrode of the TFT. A first etch of the gate electrode defines a heavily doped region in a semiconductor layer. A second etch of the gate electrode defines a light doped region in the semiconductor layer. However, repeatedly etching to the gate electrode leads to a size error of the LDD structure and increase a mask times and manufacturing cost of a display panel.

Therefore, a method of manufacturing the display panel which can solve the above-mentioned problem needs to be provided.

SUMMARY OF THE INVENTION

To solve the above-mentioned problem, the present invention provides a method of manufacturing a display panel having a plurality of lightly doped drain thin film transistors arranged as a matrix, the method includes providing a substrate; forming a semiconductor pattern with a predetermined shape on the substrate; forming a dielectric layer covering the semiconductor pattern on the substrate; forming a metal layer on the dielectric layer; forming a photoresist patterns smaller than the semiconductor pattern on the metal layer right above the semiconductor pattern; etching the metal layer to form a gate electrode smaller than the photoresist pattern; doping high concentration ions by using the photoresist pattern as a mask to form a pair of highly doped regions on the semiconductor pattern not covered by the photoresist pattern; removing the photoresist pattern; and doping low concentration ions by using the gate electrode as a mask to form a pair of lightly doped regions between the highly doped regions and a part of the semiconductor pattern covered by the gate electrode.

Wherein, a center of the gate electrode is aligned with a center of the photoresist pattern, and two opposite edges of the gate electrode is concaved inwards a preset horizontal distance relative to two opposite edges of the photoresist pattern.

Wherein, the horizontal distance is selected from a range from 0.5 μm to 1.5 μm.

Wherein, a way to etch the metal layer is selected from a group consisting of a dry etching and a wet etching.

Wherein, the material of the semiconductor pattern is a low temperature polysilicon which is made from amorphous silicon using Excimer laser annealing, metal-induced crystallization, or solid phase crystallization.

Wherein, a buffer layer is formed on the substrate before the semiconductor pattern is formed.

Wherein, the doped regions are heated to between about 400 Celsius degrees and about 1000 Celsius degrees by an ionic activation method when the ions with a predetermined concentration has been doped in the lightly doped regions.

Wherein, the metal layer is formed on the dielectric layer by sputtering.

Wherein, a projection of the photoresist pattern on the semiconductor pattern is located at a middle of the semiconductor pattern.

Wherein, a distances between a projection of one of two opposite edges of the photoresist pattern on the semiconductor pattern and one of two opposite edges of the semiconductor pattern is denoted as and the same as a distance between the other projection of the edge of the photoresist pattern and the other edge of the semiconductor pattern.

The method of manufacturing the display panel provided by the present invention only etch the metal layer once, not only reduce the manufacturing steps, but also avoid a superposed errors caused by repeatedly etching and improve an accuracy of the LDD structure.

BRIEF DESCRIPTION OF THE DRAWINGS

In order to illustrate technical schemes of the present invention or the prior art more clearly, the following section briefly introduces drawings used to describe the embodiments and prior art. Obviously, the drawing in the following descriptions just is some embodiments of the present invention. The ordinary person in the related art can acquire the other drawings according to these drawings without offering creative effort.

DETAILED DESCRIPTION OF THE PREFERRED EMBODIMENTS

The following sections offer a clear, complete description of the present invention in combination with the embodiments and accompanying drawings. Obviously, the embodiments described herein are only a part of, but not all of the embodiments of the present invention. In view of the embodiments described herein, any other embodiment obtained by the person skilled in the field without offering creative effort is included in a scope claimed by the present invention.

Figure 1:
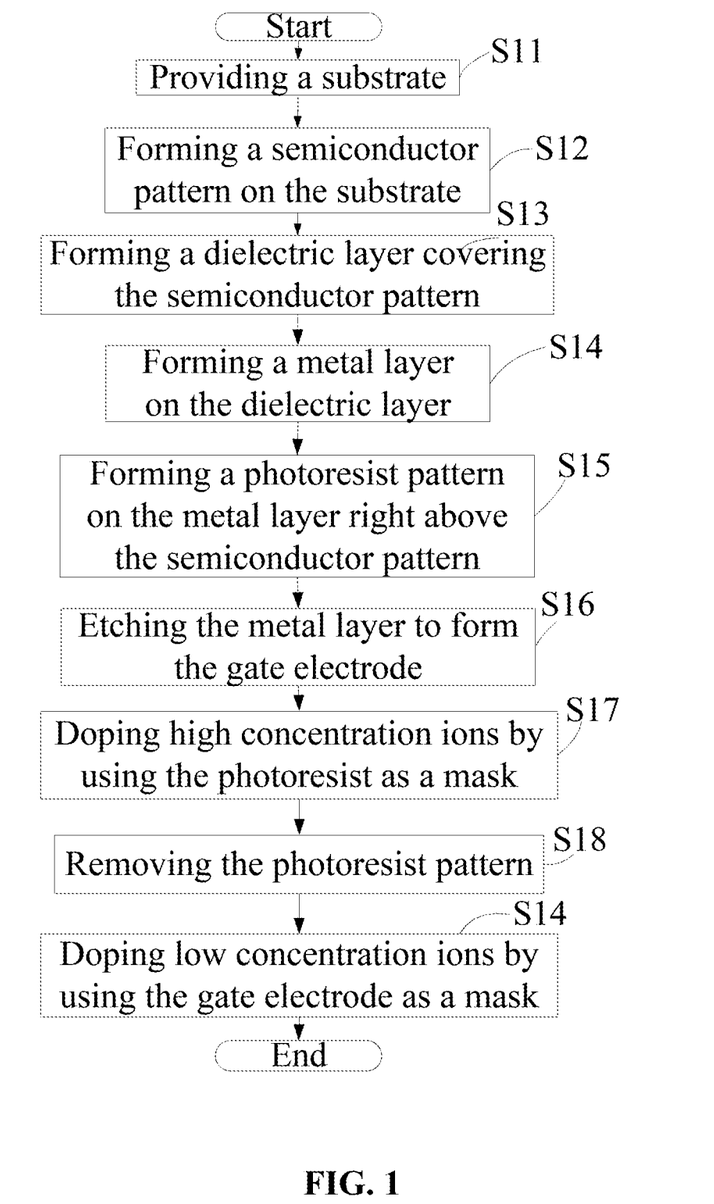
FIG. 1 is a flow chart of steps of a display panel manufacturing method in accordance with an embodiment of the present invention.
Figure 2:
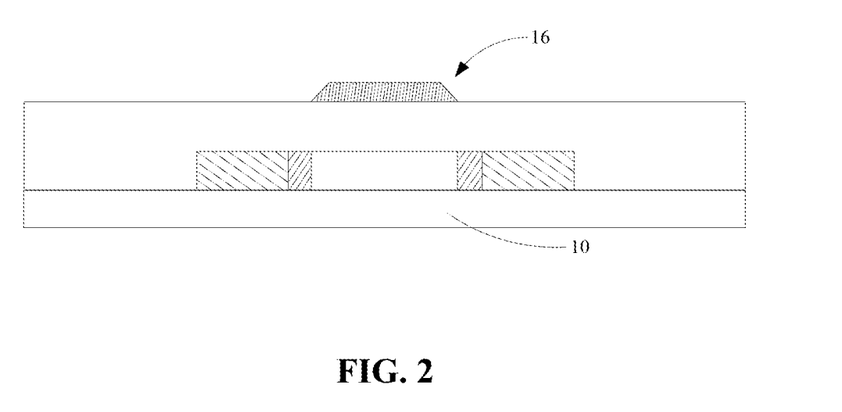
FIG. 2 is a schematic structural view of a display panel manufactured by the method of FIG. 1.
Figure 3:
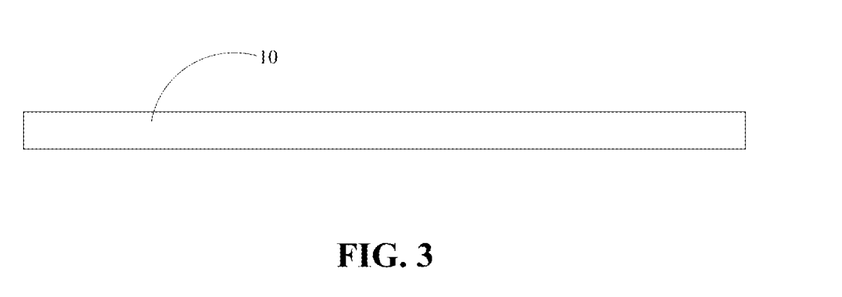
FIGS. 3-12 is schematic structural views of each steps of the method of FIG. 1.

Referring to FIG. 1, a method for manufacturing a display panel 1 in accordance with one embodiment of the present invention is used to manufacture the display panel 1 of a liquid crystal display or an organic light emitting display. Referring to FIG. 2, the display panel 1 includes a substrate 10 and a number of TFTs 16 arranged as a matrix on the substrate 10. Each of the TFTs 16 includes a LDD structure. The method of manufacturing the display panel 1 following steps:

Step S10, a substrate 10 is provided. Referring to FIG. 3, a transparent insulating material.

Figure 4:
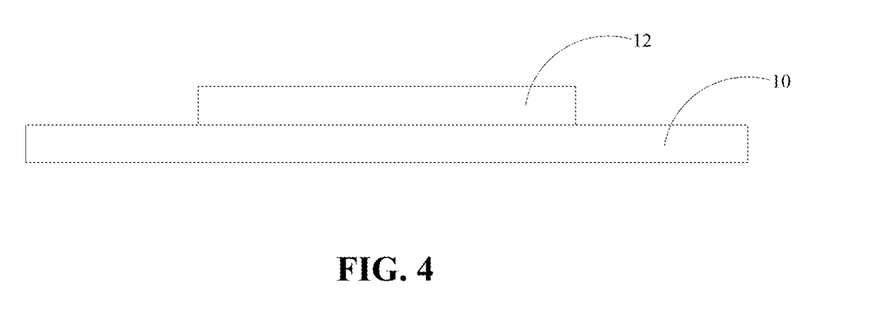

Step S12, a semiconductor pattern 12 is formed. Referring to FIG. 4, a semiconductor pattern 12 with a predetermined shape is formed on the substrate 10. In detail, a semiconductor layer is deposited on the substrate 10 at first. Then, the semiconductor layer is etched to the semiconductor pattern 12 with the predetermined shape by the photolithography process. The material of the semiconductor pattern 12 is a polysilicon which is made from amorphous silicon using low temperature polycrystalline silicon (LTPS) technology.

The LTPS technology includes Excimer laser annealing (ELA), metal-induced crystallization (MIC), and solid phase crystallization (SPC).

Figure 5:
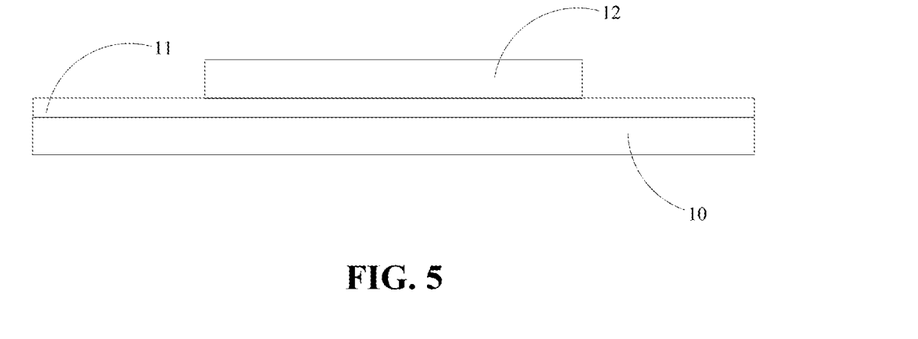

Preferentially, referring to FIG. 5, a buffer layer 11 is formed on the substrate 10 before the semiconductor pattern 12 is formed in order to reduce a influence to the semiconductor pattern 12 made by impurities in the substrate 10.

Figure 6:
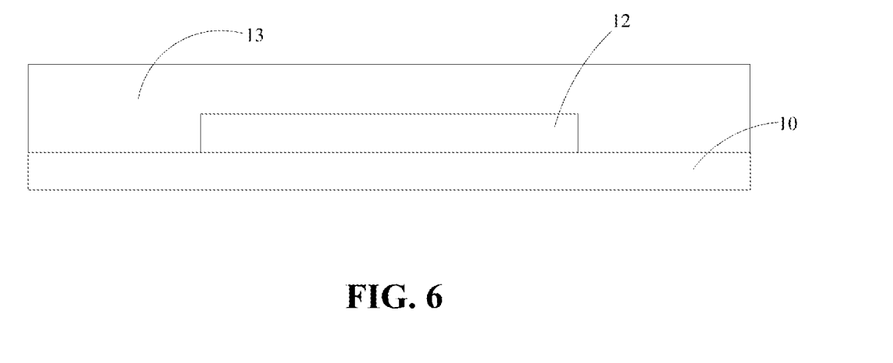

Step S13, a dielectric layer 13 is formed. Referring to FIG. 6, the dielectric layer 13 is formed to cover the semiconductor pattern 12 by depositing a dielectric material on the substrate 10.

Figure 7:
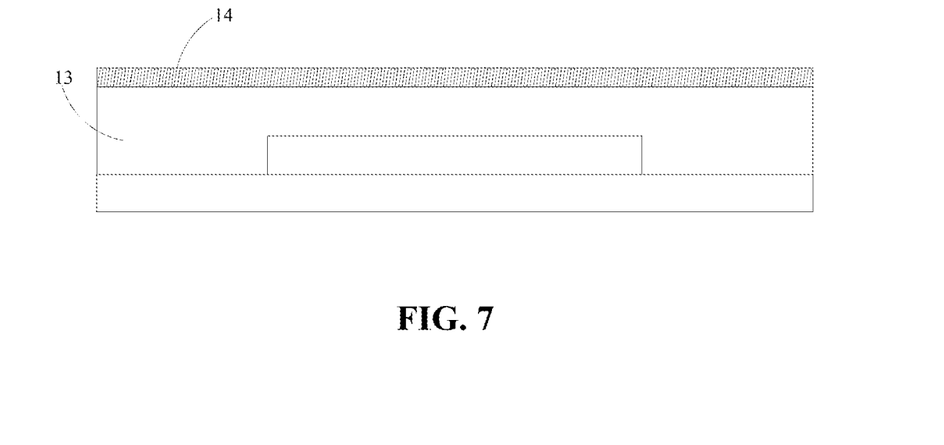

Step S14, a metal layer 14 is formed. Referring to FIG. 7, the metal layer 14 is formed on the dielectric layer 13 by sputtering.

Figure 8:
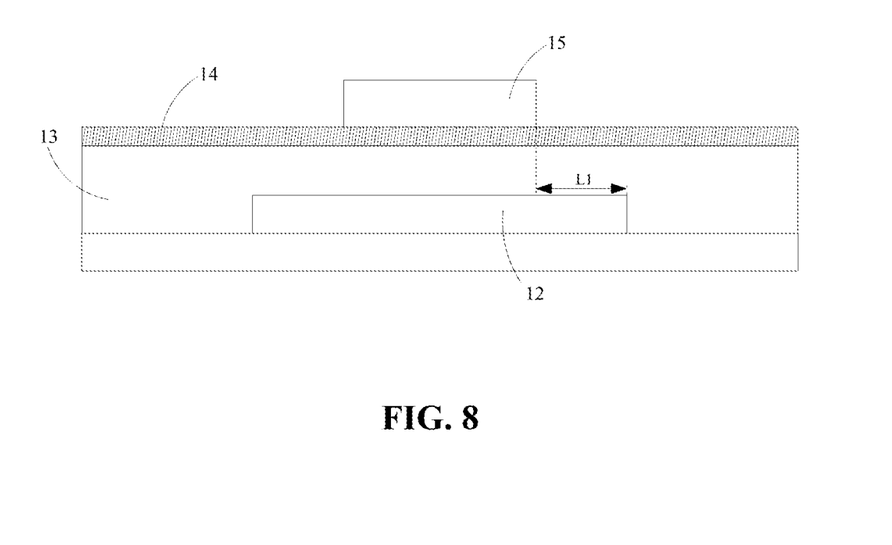

Step S15, a photoresist pattern 15 is formed. Referring to FIG. 8, the photoresist layer 15 is formed on the metal layer 14 right above the semiconductor pattern 12. In detail, a photoresist material is deposited on the metal layer 14 at first. Secondary, the photoresist material is exposed via a mask with a predetermined pattern. Thirdly, the exposed photoresist material is developed to form the photoresist pattern 15 corresponding to the predetermined pattern.

A size of the photoresist pattern 15 is less than the semiconductor pattern 12. A projection of the photoresist pattern 15 on the semiconductor pattern 12 is located at a middle of the semiconductor pattern 12. A distances between a projection of one of two opposite edges of the photoresist pattern 15 on the semiconductor pattern 12 and one of two opposite edges of the semiconductor pattern 12 is denoted as L1 and the same as a distance between the other projection of the edge of the photoresist pattern 15 and the other edge of the semiconductor pattern 12.

Figure 9:
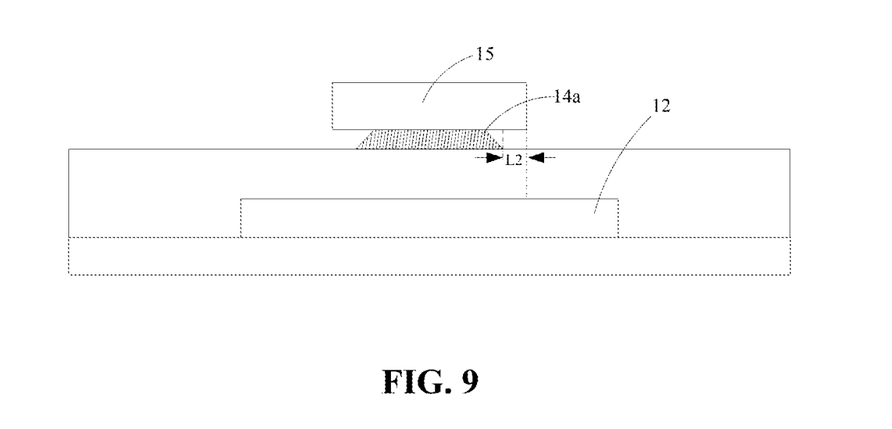

Step S16, the metal layer 14 is etched to form a gate electrode 14a. Referring to FIG. 9, the metal layer 14 is etched to form the gate electrode 14a of the TFT 16 with the predetermined pattern. A middle of the gate electrode 14a is aligned with a middle of the photoresist pattern 15. A size of the gate electrode 14a is smaller than a size of photoresist pattern 15. Two opposite edges of the gate electrode 14a is concaved inwards a preset horizontal distance L2 relative to two opposite edges of the photoresist pattern 15. In this embodiment, the horizontal distance L2 is selected from a range from 0.5 μm to 1.5 μm.

The gate electrode 14a can be etched by use of a dry etching or a wet etching. When the gate electrode 14a is wet etched, the metal layer 14a is further etched inwards the preset horizontal distance L2 after a part of metal layer 14 not covered by the photoresist pattern 15 has been etched by use of an over-etch effect of the wet etching to form the gate electrode 14a concaved inwards relative to the photoresist pattern 15.

Because etching processes of the dry etch can be accurately controlled, the edges of the gate electrode 14a are accurately formed with the distance L2 from the photoresist pattern 15 by controlling the etching process during the wet etching.

Figure 10:
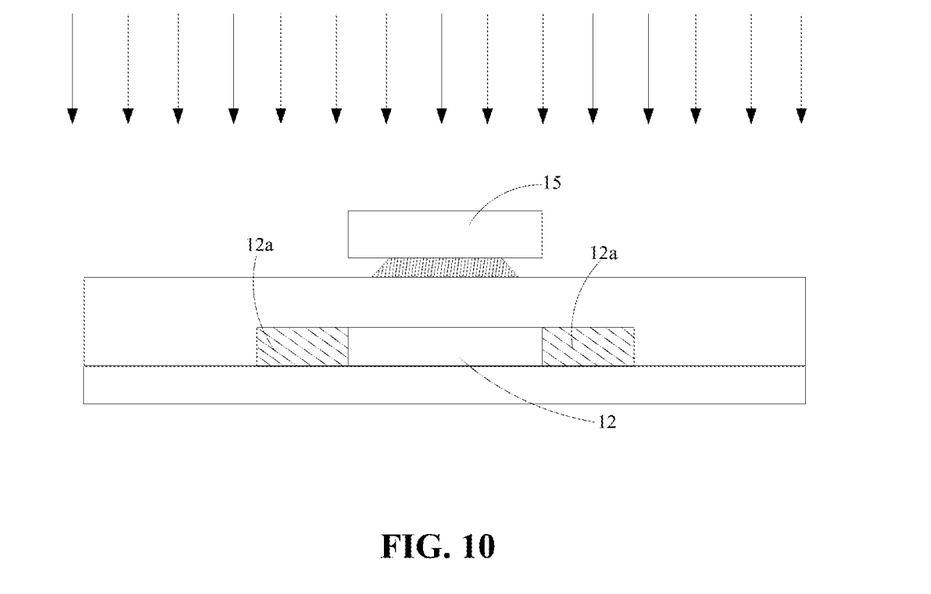

Step S17, high concentration icons are doped. Referring to FIG. 10, the semiconductor pattern 12 are doped by the high concentration icons using the photoresist pattern 15 as the mask to form a pair of highly doped regions 12a (N+ doped region or P+ doped region) correspondingly at two sides of the semiconductor pattern 12 not covered by the photoresist pattern 15 with the distance L1 away from the edges.

Figure 11:
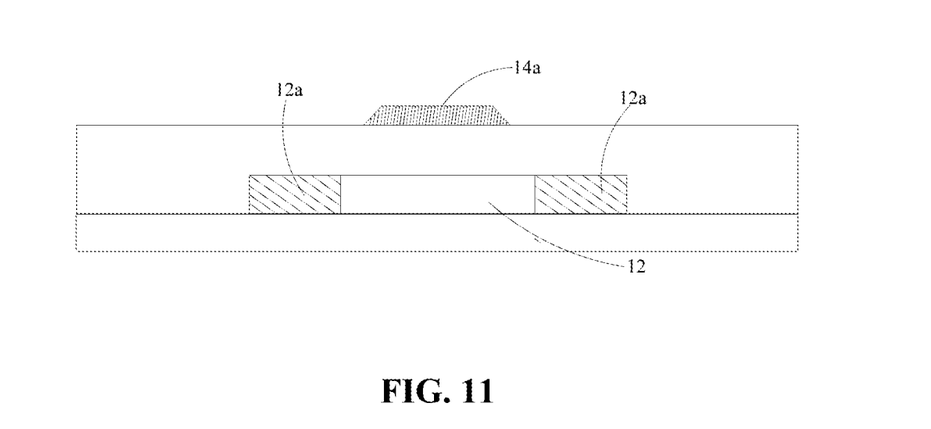

Step S18, the photoresist pattern 15 is removed. Referring to FIG. 11, the photoresist pattern 15 located above the gate electrode 14a is removed when the highly doped region 12a has been doped a predetermined concentration icons.

Figure 12:
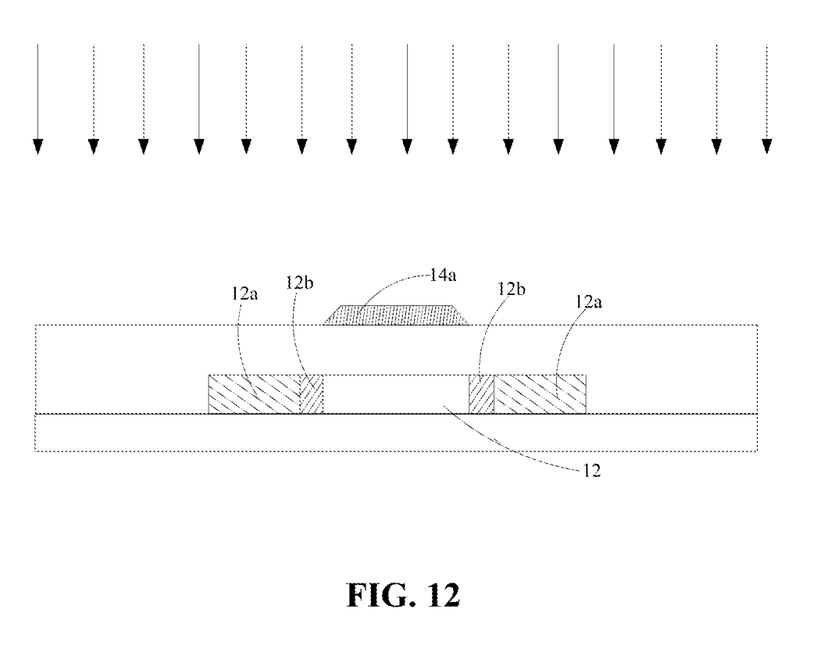

Step S19, low concentration icons are doped. Referring to FIG. 12, the low concentration icons are doped by using the gate electrode 14a as a mask. Because the edges of the gate electrode 14a is concave inwards the horizontal distance L2 relative to the corresponding edge of the photoresist pattern 15, an area with a width L2 is formed between edges of the gate electrode 14a and inner edges of the highly doped regions 12a located at two opposite sides of the semiconductor pattern 12. The area is formed to be a lightly doped region 12b after being doped the low concentration icons. Thus, the LDD structure is formed.

An area of the semiconductor pattern 12 not covered by the gate electrode 14a is functioned as a channel layer of the TFT 16. The doped regions are heated to between about 400 Celsius degrees and about 1000 Celsius degrees by an ionic activation method when the ions with a predetermined concentration has been doped in the lightly doped regions 12b. Thus, the ions in the lightly doped regions 12b and the highly doped regions 12a is activated to semi conduct the semiconductor pattern 12.

Because the method of manufacturing the display panel only etch the metal layer 14 once, not only reduce the manufacturing steps, but also avoid a superposed errors caused by repeatedly etching and improve an accuracy of the LDD structure.

What is said above are only preferred examples of present invention, not intended to limit the present invention, any modifications, equivalent substitutions and improvements etc. made within the spirit and principle of the present invention, should be included in the protection range of the present invention.

What is claimed is:

1. A method of manufacturing a display panel having a plurality of lightly doped drain thin film transistors arranged as a matrix, the method comprising:
   providing a substrate;
   forming a semiconductor pattern with a predetermined shape on the substrate;
   forming a dielectric layer covering the semiconductor pattern on the substrate;
   forming a metal layer on the dielectric layer;
   forming a photoresist patterns smaller than the semiconductor pattern on the metal layer right above the semiconductor pattern;
   etching the metal layer to form a gate electrode smaller than the photoresist pattern;
   doping high concentration ions by using the photoresist pattern as a mask to form a pair of highly doped regions on the semiconductor pattern not covered by the photoresist pattern;
   removing the photoresist pattern; and
   doping low concentration ions by using the gate electrode as a mask to form a pair of lightly doped regions between the highly doped regions and a part of the semiconductor pattern covered by the gate electrode;
   wherein a center of the gate electrode is aligned with a center of the photoresist pattern, and two opposite edges of the gate electrode is concaved inwards a preset horizontal distance relative to two opposite edges of the photoresist pattern.

2. The method of claim 1, wherein the horizontal distance is selected from a range from 0.5 μm to 1.5 μm.

3. The method of claim 1, wherein a way to etch the metal layer is selected from a group consisting of a dry etching and a wet etching.

4. The method of claim 1, wherein the material of the semiconductor pattern is a low temperature polysilicon which is made from amorphous silicon using Excimer laser annealing, metal-induced crystallization, or solid phase crystallization.

5. The method of claim 1, wherein a buffer layer is formed on the substrate before the semiconductor pattern is formed.

6. The method of claim 1, wherein the doped regions are heated to between about 400 Celsius degrees and about 1000 Celsius degrees by an ionic activation method when the ions with a predetermined concentration has been doped in the lightly doped regions.

7. The method of claim 1, wherein the metal layer is formed on the dielectric layer by sputtering.

8. The method of claim 1, wherein a projection of the photoresist pattern on the semiconductor pattern is located at a middle of the semiconductor pattern.

9. The method of claim 8, wherein a distances between a projection of one of two opposite edges of the photoresist pattern on the semiconductor pattern and one of two opposite edges of the semiconductor pattern is denoted as and the same as a distance between the other projection of the edge of the photoresist pattern and the other edge of the semiconductor pattern.

\* \* \* \* \*